US012564029B2

(12) United States Patent
Chong et al.

(10) Patent No.: US 12,564,029 B2
(45) Date of Patent: Feb. 24, 2026

(54) CONTACT VIA STRUCTURES OF SEMICONDUCTOR DEVICES

(71) Applicant: GlobalFoundries Singapore Pte. Ltd., Singapore (SG)

(72) Inventors: Yung Fu Chong, Singapore (SG); Rui Tze Toh, Singapore (SG); Fangyue Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 98 days.

(21) Appl. No.: 18/451,066

(22) Filed: Aug. 16, 2023

(65) Prior Publication Data

US 2023/0395425 A1 Dec. 7, 2023

Related U.S. Application Data

(63) Continuation of application No. 17/211,733, filed on Mar. 24, 2021, now Pat. No. 11,776,844.

(51) Int. Cl.
H01L 21/768 (2006.01)
H01L 23/528 (2006.01)
H01L 23/535 (2006.01)

(52) U.S. Cl.
CPC .. H01L 21/76804 (2013.01); H01L 21/76805 (2013.01); H01L 21/76895 (2013.01); H01L 23/5283 (2013.01); H01L 23/535 (2013.01)

(58) Field of Classification Search
CPC ......... H01L 21/76804; H01L 21/76805; H01L 21/76895; H01L 21/76831; H01L 23/5283; H01L 23/535; H01L 23/5226; H01L 23/485
See application file for complete search history.

(56) References Cited

U.S. PATENT DOCUMENTS

| | | | | |
|---|---|---|---|---|
| 5,567,270 | A | 10/1996 | Liu | |
| 5,629,237 | A | * 5/1997 | Wang | ................ H01L 21/76804 |
| | | | | 257/E21.578 |
| 6,008,513 | A | 12/1999 | Chen | |
| 6,117,726 | A | 9/2000 | Tsai et al. | |
| 6,440,792 | B1 | 8/2002 | Shiao et al. | |

(Continued)

FOREIGN PATENT DOCUMENTS

EP 369953 A * 5/1990 ........ H01L 21/31116

OTHER PUBLICATIONS

D. Fournier et al., Improvement of the RF Power Performance of nLDMOSFETs on Bulk and SOI Substrates with 'Ribbon' Gate and Source Contacts Layouts, 2009 21st International Symposium on Power Semiconductor Devices & IC's, 2009, pp. 116-119, IEEE.

(Continued)

*Primary Examiner* — Sue A Purvis
(74) *Attorney, Agent, or Firm* — Francois Pagette

(57) ABSTRACT

The embodiments herein relate to contact via structures of semiconductor devices and methods of forming the same. A semiconductor device is provided. The semiconductor device includes a substrate, a conductive feature, and a contact via structure. The conductive feature is over the substrate. The contact via structure is electrically coupled to the conductive feature and includes a curved concave profile throughout a height of the contact via structure and an upper width wider than the width of the conductive feature.

7 Claims, 5 Drawing Sheets

300

(56)                  References Cited

U.S. PATENT DOCUMENTS

|  |  |  |  |  |
|---|---|---|---|---|
| 6,503,829 | B2 * | 1/2003 | Kim | H01L 21/76804 |
|  |  |  |  | 257/E21.252 |
| 9,431,296 | B2 | 8/2016 | Basker et al. |  |
| 9,548,366 | B1 * | 1/2017 | Ho | H10D 84/0149 |
| 10,153,351 | B2 * | 12/2018 | Hsu | H01L 21/76832 |
| 10,163,778 | B2 * | 12/2018 | Peng | H01L 23/5226 |
| 10,355,017 | B1 | 7/2019 | Nakatsuji et al. |  |
| 10,515,849 | B2 * | 12/2019 | Khaderbad | H01L 21/76804 |
| 10,998,259 | B2 * | 5/2021 | Tsai | H01L 21/0276 |
| 2006/0003536 | A1 | 1/2006 | Kudelka |  |
| 2007/0035026 | A1 * | 2/2007 | Su | H01L 21/76847 |
|  |  |  |  | 257/E21.578 |
| 2007/0155157 | A1 * | 7/2007 | Chou | H01L 21/76829 |
|  |  |  |  | 438/618 |
| 2010/0224936 | A1 * | 9/2010 | Hokazono | H10D 84/0149 |
|  |  |  |  | 257/E21.627 |
| 2017/0053868 | A1 * | 2/2017 | Lin | H01L 21/76814 |
| 2018/0151560 | A1 | 5/2018 | Hsu et al. |  |
| 2022/0157725 | A1 | 5/2022 | Gupta |  |

OTHER PUBLICATIONS

Petrillo et al., Utilization of spin-on and reactive ion etch critical dimension shrink with double patterning for 32 nm and beyond contact level interconnects, Advances in Resist Materials and Processing Technology XXVI, 2009, pp. 72731A-1-72731A-7, vol. 7273, SPIE.

Younkin et al., Progress in directed self-assembly hole shrink applications, Advances in Resist Materials and Processing Technology XXX, 2013, pp. 86820L-1-86820L-11, vol. 8682, SPIE.

Op De Beeck et al., A novel plasma-assisted shrink process to enlarge process windows of narrow trenches and contacts for 45-nm node applications and beyond, Advances in Resist Materials and Processing Technology XXIV, 2007, pp. 65190U-1-65190U-9, vol. 6519, SPIE.

* cited by examiner

300

CONTACT VIA STRUCTURES OF SEMICONDUCTOR DEVICES

TECHNICAL FIELD

The present disclosure relates generally to semiconductor devices, and more particularly to contact via structures of semiconductor devices and methods of forming the same.

BACKGROUND

With technological advances in the semiconductor integrated circuit industry, there is a continuing demand for device miniaturization. The feature sizes in semiconductor devices have decreased significantly, providing greater integration and greater capacity. The conventional approach to pattern smaller feature sizes is to rely on improvements to patterning techniques, such as the photolithography process. However, such improvements can be time-consuming and costly Therefore, in order to keep up with the technological advances, contact via structures suitable for increasingly smaller feature geometries in a semiconductor device and methods of forming the same are provided to overcome, or at least ameliorate, the disadvantages described above.

SUMMARY

To achieve the foregoing and other aspects of the present disclosure, contact via structures of semiconductor devices and methods of forming the same are presented.

According to an aspect of the present disclosure, a semiconductor device is provided. The semiconductor device includes a substrate, a conductive feature, and a contact via structure. The conductive feature is over the substrate. The contact via structure is electrically coupled to the conductive feature and includes a curved concave profile throughout a height of the contact via structure and an upper width wider than the width of the conductive feature.

According to another aspect of the present disclosure, a semiconductor device is provided. The semiconductor device includes a substrate, a conductive feature, and a contact via structure. The conductive feature is over the substrate and includes a width. The contact via structure is electrically coupled to the conductive feature and includes sidewalls having an upper portion and a lower portion. The upper portion of the sidewalls has a first gradient and the lower portion of the sidewalls has a second gradient steeper than the first gradient. An uppermost width of the contact via structure defined between the upper portion of the sidewalls is wider than the width of the conductive feature.

According to yet another aspect of the present disclosure, a semiconductor device is provided. The semiconductor device includes a substrate, a conductive feature, a dielectric layer, dielectric spacers, and a contact via structure. The conductive feature is over the substrate and includes a width. The dielectric layer is over the substrate. The dielectric spacers are in the dielectric layer and define a contact opening between the dielectric spacers. The contact via structure is in the contact opening electrically coupled to the conductive feature. The contact via structure includes a curved concave profile and an upper width wider than the width of the conductive feature.

BRIEF DESCRIPTION OF THE DRAWINGS

The embodiments of the present disclosure will be better understood from a reading of the following detailed description, taken in conjunction with the accompanying drawings.

Figure 1:
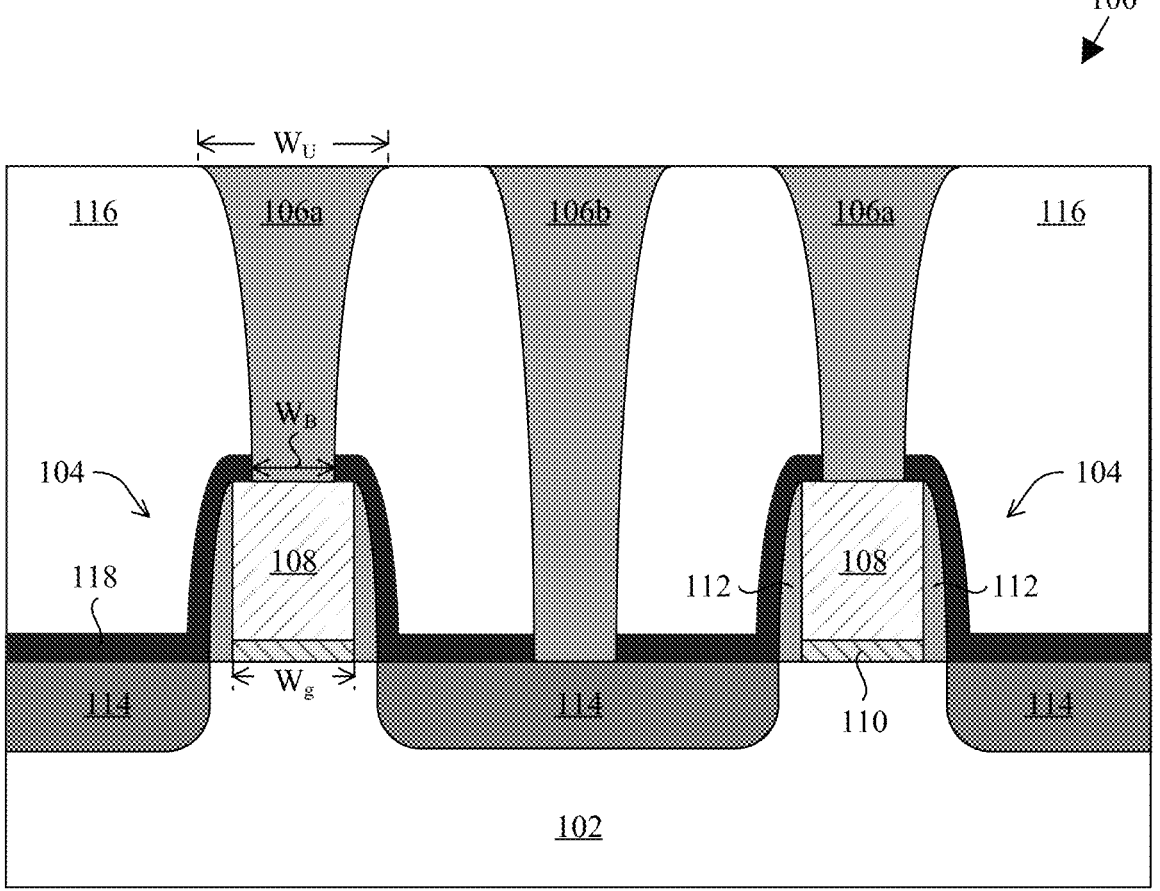
FIG. 1 is a cross-sectional view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to contact via structures of semiconductor devices and methods of forming the same.

It is understood that the following disclosure is not limited to any particular type of semiconductor device. The disclosure may be applied to any type of semiconductor devices, such as radio frequency (RF) devices, tri-gate field-effect transistor devices, fin-type field-effect transistor (FinFET) devices, or planar-type metal-oxide-semiconductor field-effect transistor (MOSFET) devices.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of a semiconductor device 100, according to an embodiment of the disclosure. The semiconductor device 100 may include a substrate 102, a plurality of transistor devices 104, and a plurality of contact via structures 106a, 106b.

The substrate 102 may include a semiconductor material, such as silicon, silicon germanium, silicon carbide, other II-VI or III-V semiconductor compounds, and the like. Furthermore, the substrate 102 may be in a form of a bulk semiconductor substrate or a layered semiconductor substrate, such as a semiconductor-on-insulator (SOI) substrate.

The transistor devices 104 may be fabricated over the substrate 102. Each transistor device 104 may include a gate electrode 108, a gate dielectric layer 110 underlying the gate electrode 108, a pair of gate spacers 112 overlying sidewalls of the gate electrode 108, and a pair of doped regions 114 at laterally opposite sides of the gate electrode 108. The gate electrode 108 can be an active or passive component of the transistor 104. In an embodiment of the disclosure, the gate electrode 108 may be an active component that affects the performance of the semiconductor device 100. In another embodiment of the disclosure, the gate electrode 108 has a width $W_g$.

The pair of doped regions 114 may be provided in an active region (not shown) of the substrate 102 and may function as source and drain regions of the transistor devices 104. The active region may take on various architectural forms such as raised fin-like channels that extend above the substrate 102 or a planar continuous region in the substrate 102.

The pair of doped regions 114 may have different dopant conductivity types, such as P-type or N-type conductivity, as well as different dopant depths and different dopant concentrations. The dopant concentrations and/or dopant depths in the active region, for example, may vary depending on the technology node and design requirements for the semiconductor device 100. In an embodiment of the disclosure, the pair of doped regions 114 may also include lightly-doped drain (LDD) regions (not shown), without departing from the spirit and scope of the present disclosure.

The semiconductor device 100 may further include a dielectric layer 116 over the transistor devices 104 and the plurality of contact via structures 106a, 106b may be provided in the dielectric layer 116. The dielectric layer 116 may be referred to as an inter-layer dielectric (ILD) layer. The contact via structures 106a, 106b may be provided over the gate electrodes 108 and the doped regions 114, respectively. The contact via structures 106a electrically coupled to the gate electrodes 108 may be referred to as gate contact via structures. The contact via structure 106b electrically coupled to the doped region 114 may be referred to as a source/drain contact via structure.

As illustrated in FIG. 1, the contact via structures 106a, 106b may have a tapered and curved concave profile. The contact via structures 106a, 106b may be tapered in a direction such that the contact via structures 106a, 106b have a width that decreases non-linearly towards the substrate 102 from an upper surface of the dielectric layer 116, i.e., the widths of the contact via structures 106a, 106b are narrowest proximal to the substrate 102. For example, sidewalls of the contact via structure 106a proximal to the substrate 102 may have a steeper gradient than that of the sidewalls distal to the substrate 102. In an embodiment of the disclosure, the bottom width $W_B$ may be at most as wide as the width $W_g$ of the gate electrode 108. In another embodiment of the disclosure, the upper width $W_U$ may be wider than the width $W_g$ of the gate electrode 108.

The semiconductor device 100 may further include a dielectric liner 118 over the transistor devices 104. The dielectric liner 118 may be an etch stop layer having a relatively high etch selectivity to the dielectric layer 116, thereby allowing precision in forming overlying features, such as the contact via structures 106a, 106b. The dielectric liner 118 advantageously minimizes any potential damage caused to the transistor devices 104 during the fabrication process. In an embodiment of the disclosure, the dielectric liner 118 may include a non-conducting material. In another embodiment of the disclosure, the dielectric liner 118 may include an oxide, nitride, oxynitride, or combinations thereof.

FIGS. 2A to 2E are cross-sectional views that illustrate a method of forming the semiconductor device 100 in FIG. 1, according to an embodiment of the disclosure. Certain structures may be conventionally fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes. Such techniques may use mask sets and mask layers with dopants having a desired conductivity type.

Figure 2A:
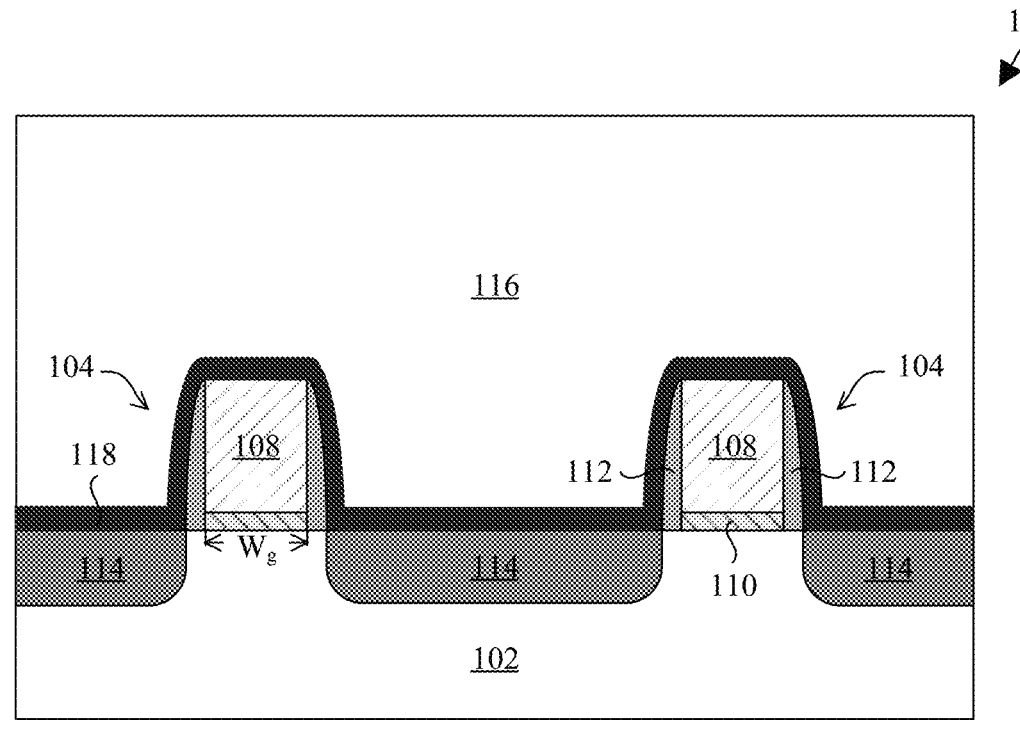
FIGS. 2A to 2E are cross-sectional views that illustrate a method of forming the semiconductor device in FIG. 1, according to an embodiment of the disclosure.

FIG. 2A illustrates the semiconductor device 100 after forming a plurality of transistor devices 104 over a substrate 102, according to an embodiment of the disclosure. Each transistor device 104 may include a gate electrode 108, a gate dielectric layer 110 underlying the gate electrode 108, a pair of gate spacers 112 overlying sidewalls of the gate electrode 108, and a pair of doped regions 114 at laterally opposite sides of the gate electrode 108.

A dielectric layer 116 may be deposited over the transistor devices 104 using a deposition process. The dielectric layer 116 may be referred to as an inter-layer dielectric (ILD) layer. The dielectric layer 116 may include a dielectric material suitable to at least electrically isolate conductive features ultimately formed therein while maintaining a robust structure during the subsequent fabrication processes. The dielectric layer 116 may include a dielectric material such as, but not limited to, silicon dioxide, borophosphosilicate glass (BPSG), undoped silicate glass (USG), or other dielectric materials known in the art.

A dielectric liner 118 may be interposed between the transistor devices 104 and the dielectric layer 116; the dielectric liner 118 conformally overlays the transistor devices 104. The dielectric liner 118 may serve as an etch stop layer. As mentioned above, it may be preferable that the dielectric liner 118 provides a relatively high etch selectivity to the dielectric layer 116 such that the removal of the dielectric layer 116 does not substantially affect the dielectric liner 118. In an embodiment of the disclosure, the dielectric liner 118 may include silicon nitride or other suitable dielectric materials known in the art.

Figure 2B:
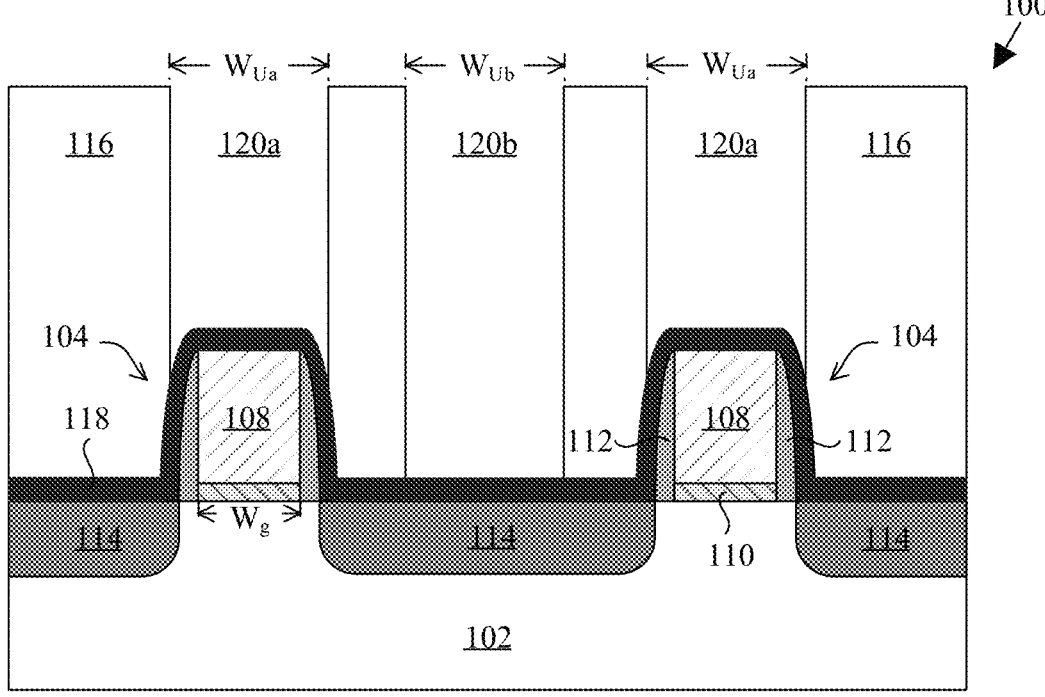

FIG. 2B illustrates the semiconductor device 100 after forming openings 120a, 120b in the dielectric layer 116, according to an embodiment of the disclosure. The openings 120a, 120b may be formed using a patterning technique. Portions of the dielectric liner 118 may be exposed in the openings 120a, 120b after the patterning technique.

The opening 120a may be formed over the gate electrode 108 of each transistor device 104 and may have a width $W_{Ua}$. The opening 120b may be formed over the doped region 114 and may have a width $W_{Ub}$. It is understood that the width $W_{Ua}$ of the opening 120a may be wider or narrower than the width $W_{Ub}$ of the opening 120b, even though FIG. 2B illustrates the openings 120a, 120b to have similar widths. In an embodiment of the disclosure, the width $W_{Ua}$ is wider than the width $W_g$ of the gate electrode 108.

It will be appreciated that the openings 120a, 120b may have a width that is wider than a bottom width of the contact via structures that will be ultimately formed therein. By forming the relatively wider openings, the openings 120a, 120b may be patterned using conventional patterning techniques, obviating the need for expensive advanced patterning equipment, such as immersion photolithography or extreme ultra-violet (EUV) lithography equipment, which is necessary for patterning features of small geometries.

Figure 2C:
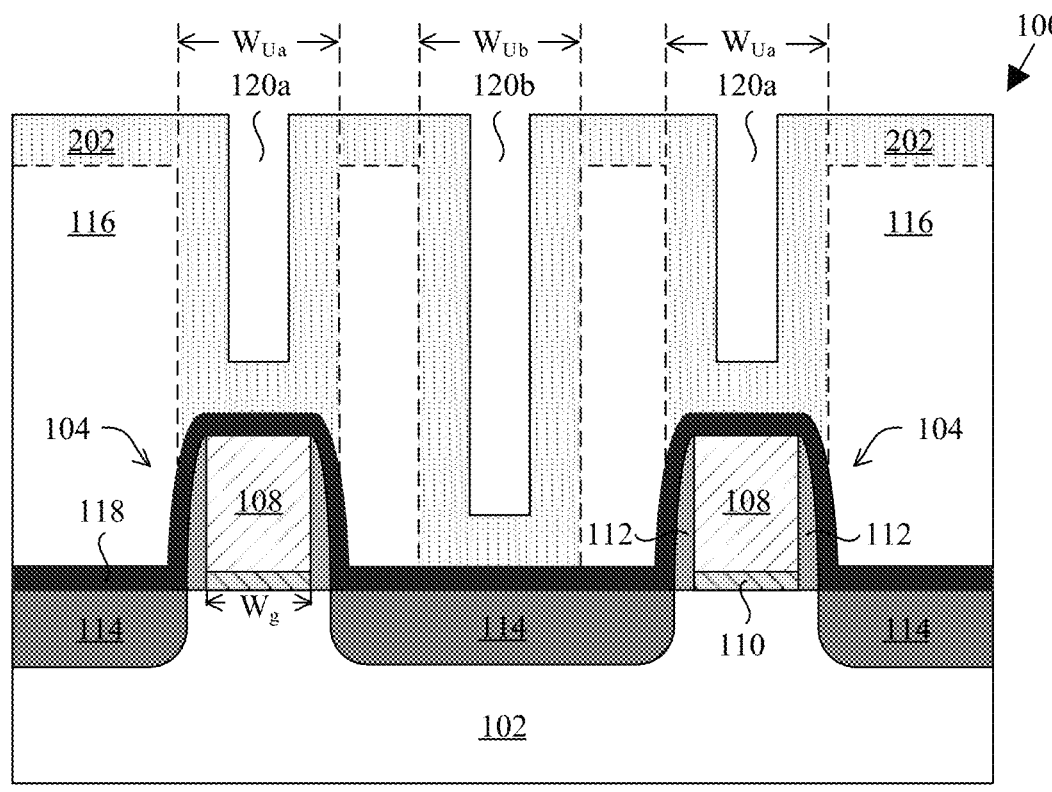

FIG. 2C illustrates the semiconductor device 100 after forming a dielectric control layer 202, according to an embodiment of the disclosure. The dielectric control layer 202 may be conformally deposited over the dielectric layer 116 and in the openings 120*a*, 120*b*, i.e., the dielectric control layer 202 may overlay the upper surface and side-walls of the dielectric layer 116, as well as the exposed portions of the dielectric liner 118 in the openings 120*a*, 120*b*. In an embodiment of the disclosure, the dielectric control layer 202 may be deposited using a conformal deposition technique, for example, an ALD process or a conformal CVD process.

The dielectric control layer 202 may be conformally deposited to a thickness to partially fill the openings 120*a*, 120*b*. The dielectric control layer 202 may be deposited to a predetermined thickness such that the width of the openings 120*a* may be reduced to a width at most as wide as the width $W_g$ of the gate electrode 108.

In an embodiment of the disclosure, the dielectric control layer 202 may include a dielectric material that is substantially similar to the dielectric layer 116, such as silicon dioxide, borophosphosilicate glass (BPSG), or undoped silicate glass (USG). As such, the interface between the dielectric control layer 202 and the dielectric layer 116 may not be apparent and is demarcated by a dashed line, as illustrated in FIG. 2C. Advantageously, by forming the dielectric control layer 202 using a substantially similar dielectric material as the dielectric layer 116, the dielectric control layer 202 may form part of the dielectric layer 116 and further improves the electrical isolation of the dielectric layer 116 while keeping the dielectric constant low for improved device performance.

In another embodiment of the disclosure, the dielectric control layer 202 may include a dielectric material that may not be substantially similar to the dielectric layer 116. Accordingly, the interface between the dielectric control layer 202 and the dielectric layer 116 may be apparent.

Figure 2D:
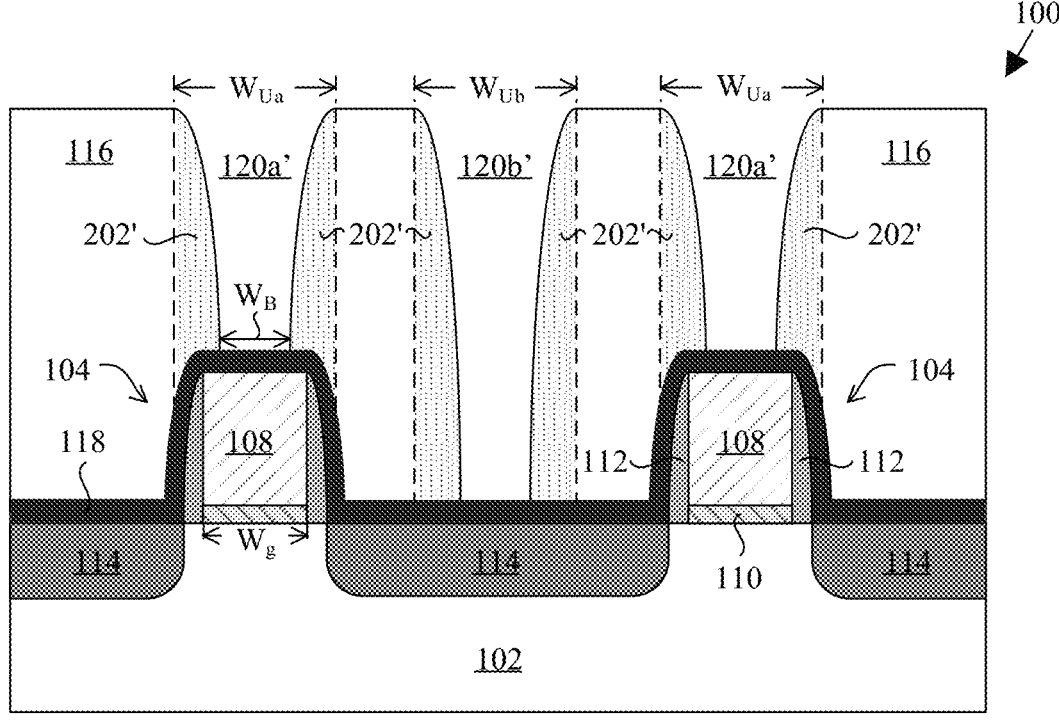

FIG. 2D illustrates the semiconductor device 100 after forming dielectric spacers 202', according to an embodiment of the disclosure. Portions of the dielectric control layer 202 may be removed using a directional material removal technique, such as an anisotropic etching process. The material removal technique may remove the portions of the dielectric control layer 202 overlying the upper surface of the dielectric layer 116 and the exposed dielectric liner 118, while portions of the dielectric control layer 202 overlying side-walls of the dielectric layer 116 that define the openings 120*a*, 120*b* may be expected to remain, forming the dielectric spacers 202'.

The dielectric spacers 202' may have a tapered and curved convex profile and define contact openings 120*a'*, 120*b'*. Portions of the dielectric liner 118 may be exposed in the contact openings 120*a'*, 120*b'*. The dielectric spacers 202' may be tapered in a direction such that the dielectric spacers 202' have a width that increases towards the substrate 102 from an upper surface of the dielectric layer 116, i.e., the dielectric spacers 202' may have a bottom width largest proximal to the substrate 102 to form the contact opening 120*a'* having a bottom width $W_B$ narrower than an upper width $W_{Ua}$. In an embodiment of the disclosure, the bottom width $W_B$ may be at most as wide as the width $W_g$ of the gate electrode 108. In another embodiment of the disclosure, the upper width $W_U$ may be wider than the width $W_g$ of the gate electrode 108.

The dielectric control layer 202 advantageously provides an attractive solution for controlling the bottom widths of the contact openings 120*a'*, 120*b'*. For example, by forming a relatively thicker dielectric control layer 202 as illustrated in FIG. 2C, the thickness of the corresponding dielectric spacers 202' may form contact openings 120*a'*, 120*b'* having a relatively narrower bottom width. In another example, by forming a relatively thinner dielectric control layer 202, the thickness of the corresponding dielectric spacers 202' may form contact openings 120*a'*, 120*b'* having a relatively wider bottom width.

Figure 2E:
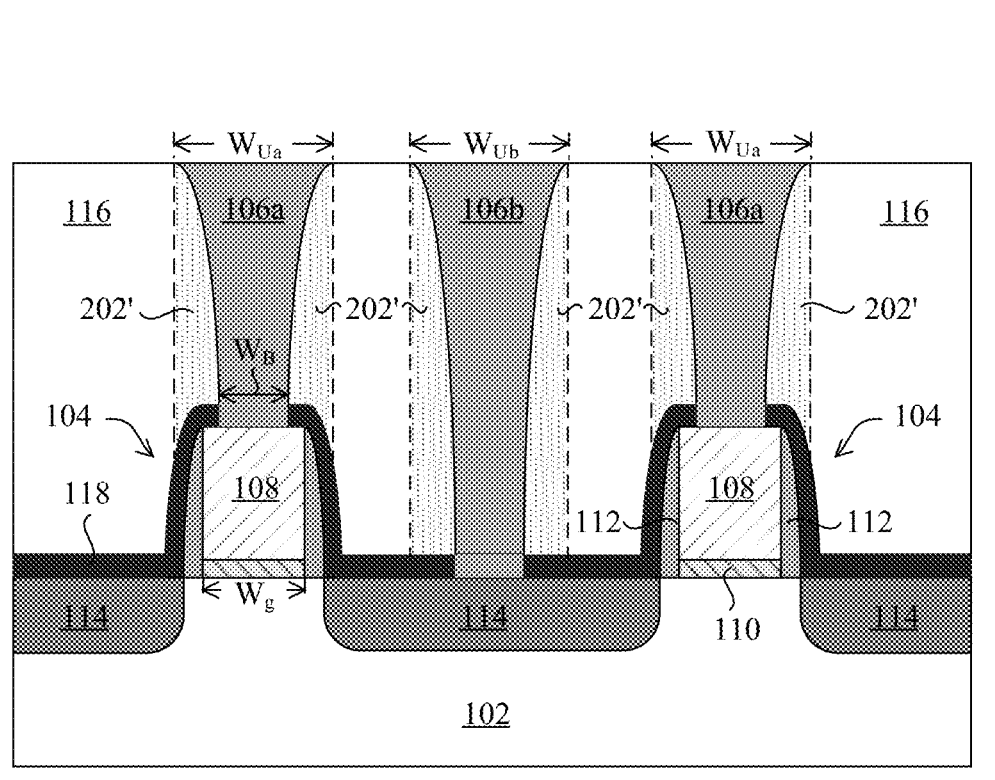

FIG. 2E illustrates the semiconductor device 100 after forming contact via structures 106*a*, 106*b*, according to an embodiment of the disclosure. A conductive material may be deposited to fill the contact openings 120*a'*, 120*b'* using a deposition technique. A planarization process may be performed to form a substantially planar topography over the semiconductor device 100. The contact via structures 106*a*, 106*b* may have a tapered and curved concave profile. In an embodiment of the disclosure, the conductive material may include copper, tungsten, or other conductive materials known in the art.

The exposed portions of the dielectric liner 118 in the contact openings 120*a'*, 120*b'* may be removed using a material removal technique before forming the contact via structures 106*a*, 106*b*. The contact via structures 106*a* may be electrically coupled to the gate electrodes 108 and may be referred to as gate contact via structures. The contact via structure 106*b* may be electrically coupled to the doped region 114 and may be referred to as a source/drain contact via structure. As used herein, when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

In an embodiment of the disclosure, one or more liners may be formed during the formation of the contact via structures 106*a*, 106*b*, although not shown in FIG. 2E. For example, an adhesion liner and/or a barrier liner may be deposited in the contact openings 120*a'*, 120*b'* before forming the contact via structures 106*a*, 106*b*. The adhesion liner may include metal silicides such as, but not limited to, titanium silicide, nickel silicide, or other suitable adhesion material known in the art. The barrier liner may include metal nitrides such as, but not limited to, titanium nitride, tantalum nitride, or other suitable barrier material known in the art.

It is understood that the semiconductor device 100 may undergo further processing to form various semiconductor features known in the art. For example, a plurality of conductive lines and interconnect vias may be formed to route, as needed, across the semiconductor device 100.

Even though the contact via structures 106*a*, 106*b* in FIG. 1 are illustrated to be formed over transistor devices, it will be appreciated that the similar contact via structures may be formed in other regions of the semiconductor device to electrically couple other conductive features. The contact via structures may, for example, be formed in a back-end-of-line region of a semiconductor device, as illustrated in FIG. 3.

Figure 3:
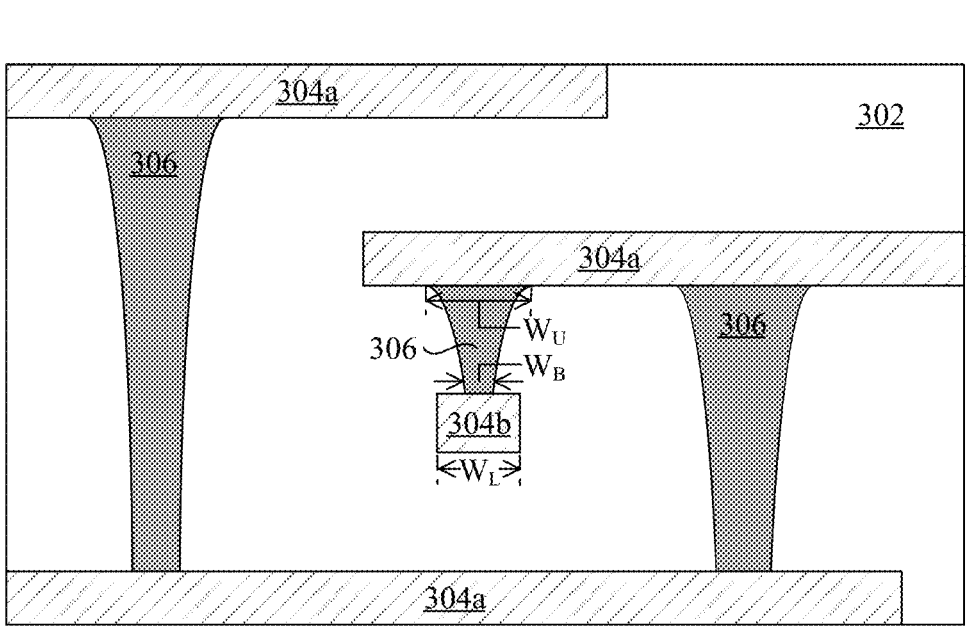
FIG. 3 is a cross-sectional view of a semiconductor device, according to another embodiment of the disclosure.

FIG. 3 is a cross-sectional view of a semiconductor device 300, according to another embodiment of the disclosure Similar to the semiconductor device 100 in FIG. 1, the semiconductor device 300 may include a substrate (not shown), a dielectric layer 302, and a plurality of contact via structures 306.

The dielectric layer 302 may be arranged over the substrate (not shown) and may be referred to as an inter-metal dielectric (IMD) layer. A plurality of conductive lines 304*a*, 304*b* may be provided in the dielectric layer 302. In an embodiment of the disclosure, the conductive line 304*b* may be substantially perpendicular to the conductive lines 304*a*.

The contact via structures 306 may be electrically coupled to the conductive lines 304*a*, 306*b*. As illustrated in FIG. 3, the contact via structures 306 may have a bottom width $W_B$ narrower than an upper width $W_U$. In an embodiment of the disclosure, the bottom width $W_B$ of the contact via structure 306 that is electrically coupled to the conductive line 304*b* may have a width at most as wide as a width $W_L$ of the conductive line 304*b*. In another embodiment of the disclosure, the upper width $W_U$ of the contact via structure 306 may be wider than the consecutive line 304*b*.

It is understood that the number and placements of the plurality of conductive lines 304*a*, 306*b* and the plurality of the contact via structures 306 may vary according to the specific design of each semiconductor device.

As presented in the above disclosure, contact via structures of semiconductor devices and methods of forming the same are presented. The contact via structures may be electrically coupled to underlying conductive features. The contact via structures may have a tapered and curved concave profile that has a width that decreases non-linearly towards a substrate. The contact via structures may have a bottom width at most as wide as a width of the conductive features. The contact via structures may have an upper width wider or narrower than the width of the conductive features. For example, where the conductive feature is a gate electrode of a transistor device, the contact via structure may have a bottom width at most as wide as a width of the gate electrode. In another example, where the conductive feature is a conductive line, the contact via structure may have a bottom width at most as wide as a width of the conductive line.

An exemplary method of forming a contact via structure over a transistor device is described herein. The transistor device may include a gate electrode having a width of about 45 nm. An opening having a width of about 70 nm may be formed in a dielectric layer over the gate electrode using conventional photolithography equipment. Patterning feature sizes of about 70 nm may be accomplished using conventional photolithography equipment, while patterning feature sizes of about 45 nm may typically require advanced lithography equipment, such as immersion photolithography equipment. A dielectric control layer of about 20 nm to 30 nm may be conformally deposited in the opening. A directional material removal technique may be performed to form dielectric spacers on sidewalls of the opening. The dielectric spacers define contact openings having a bottom width of about 10 nm to about 30 nm.

The above disclosure advantageously provides an attractive solution for controlling the widths of the contact via structures. With technology scaling, in order to reliably fabricate features of small geometries, the use of advanced patterning processes provided by expensive advanced patterning equipment may be necessary. However, by using a dielectric control layer to control the widths of the contact openings, the contact via structures having narrower bottom widths may be reliably fabricated that overcomes the process limitations of conventional patterning processes, thus providing a greater cost advantage to the fabrication process. Furthermore, the concave profiles of the contact openings advantageously facilitate the formation of the contact via structures.

Additionally, the above disclosure may advantageously enable the contact via structures to be formed over the gate electrodes that are over an active region of the substrate; such contact via structures may be referred to as a contact over active gate (COAG). Typically, such contact via structures are formed over isolation regions to avoid electrically shorting to neighboring conductive features. However, such placements of contact via structures create a longer gate transporting length and a higher gate resistance that may be undesirable for some IC devices whose performances are sensitive to gate resistance.

Providing the contact via structures over the active region advantageously increases transistor density in a semiconductor device while shortening the gate transporting length, thereby minimizing the gate resistance that may be desirable for transistor devices, in particular, RF devices. Gate resistance, along with other parasitic components such as parasitic inductance, capacitance, etc., may combine to attenuate and degrade the RF signals considerably. RF signal losses are more significant at a higher operating frequency and it is critical to ensure the RF signal losses are kept low, or at least at an acceptable level, for a specific application.

Therefore, reducing gate resistance is crucial for RF devices as the electrical performance of the RF devices is sensitive to gate resistance. The lower the gate resistance of an RF device, the higher the maximum frequency achievable, thereby realizes an RF device having improved electrical performance.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device, comprising:
a substrate;
a conductive feature over the substrate, wherein the conductive feature comprises a width;

a dielectric layer over the substrate;
dielectric spacers in the dielectric layer defining a contact opening between the dielectric spacers; and
a contact via structure in the contact opening electrically coupled to the conductive feature, wherein the contact via structure comprises a curved concave profile and an upper width wider than the width of the conductive feature.

2. The semiconductor device of claim 1, wherein the dielectric layer comprises an upper surface and each dielectric spacer comprises a curved convex profile extending downwardly from the upper surface of the dielectric layer.

3. The semiconductor device of claim 2, wherein the contact opening has a width between the dielectric spacers, and the width comprises a non-linearly decreasing width towards the substrate from the upper surface of the dielectric layer throughout a height of the opening.

4. The semiconductor device of claim 1, wherein the dielectric layer comprises a first dielectric material and the dielectric spacers comprise a second dielectric material substantially similar to the first dielectric material.

5. The semiconductor device of claim 4, wherein the conductive feature is a gate electrode of a transistor or a conductive line in a back-end-of-line region of the semiconductor device.

6. The semiconductor device of claim 1, wherein the dielectric layer comprises a dielectric oxide material and the dielectric spacers comprise a dielectric nitride material.

7. The semiconductor device of claim 1, wherein the contact via structure comprises a bottom width at most as wide as the width of the conductive feature.

* * * * *